United States Patent [19]

Kovac et al.

[11] Patent Number: 5,190,065

[45] Date of Patent: Mar. 2, 1993

[54] SELF-CONTAINED WASHING UNIT FOR PRINTED CIRCUIT BOARDS

[75] Inventors: Jimmy L. Kovac, Charlotte; Jeffrey T. LeVie, Mt. Holly, both of N.C.

[73] Assignee: International Business Machines Corporation, Armonk, N.Y.

[21] Appl. No.: 799,815

[22] Filed: Nov. 29, 1991

[51] Int. Cl.⁵ .................. B08B 3/02; B08B 13/00
[52] U.S. Cl. .................... 134/107; 134/108; 134/111; 134/902
[58] Field of Search ........... 134/107, 108, 109, 111, 134/902

[56] References Cited

U.S. PATENT DOCUMENTS

| | | | |
|---|---|---|---|
| 2,249,792 | 7/1941 | Skinner | 134/107 X |
| 2,425,848 | 8/1947 | Vawter | 134/111 X |
| 2,949,119 | 8/1960 | Smith | 134/108 X |
| 3,276,458 | 10/1966 | Iversen et al. | 134/57 R |
| 3,595,252 | 7/1971 | Conte | 134/109 |
| 4,595,498 | 6/1986 | Cohen et al. | 210/192 |
| 4,610,790 | 9/1986 | Reti et al. | 210/636 |
| 4,635,666 | 1/1987 | Daley et al. | 134/172 |
| 4,672,985 | 6/1987 | Mohr | 134/111 X |
| 4,865,061 | 9/1989 | Fowler et al. | 134/109 X |
| 4,899,767 | 2/1990 | McConnell et al. | 134/56 R |

FOREIGN PATENT DOCUMENTS 658394 4/1979 U.S.S.R. ............... 134/111

*Primary Examiner*—Philip R. Coe
*Attorney, Agent, or Firm*—A. P. Tennent

[57] ABSTRACT

A deionized water cleaning system suitable for movement as a complete unit to different locations. The unit includes an integrated rinse and sump tank where the PC boards are washed and the water is collected. The sump is sized to allow the water temperature to be lowered before leaving the tank. The water is cleaned by a filter system which includes particle filters, deionizers, and an ultraviolet sterilizer. The cleaned water is recirculated through the tank and is allowed to be diverted through an on-demand water heater when the water is to be used for washing. A back pressure regulator assists the diversion through the heater and a float switch allows for automatic replenishing of the water in the system. All of the components are supported by a platform structure which can be easily moved.

14 Claims, 2 Drawing Sheets

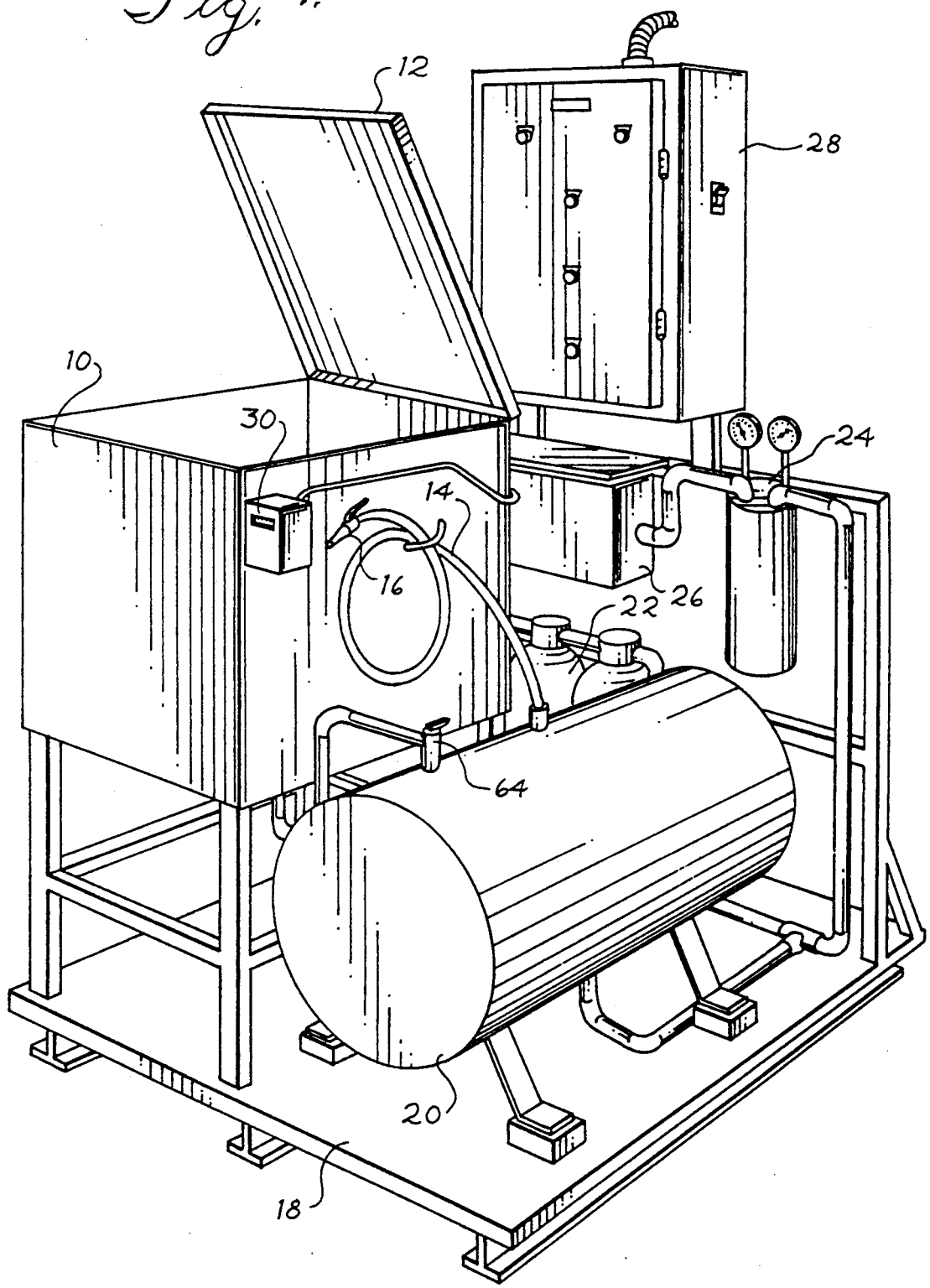

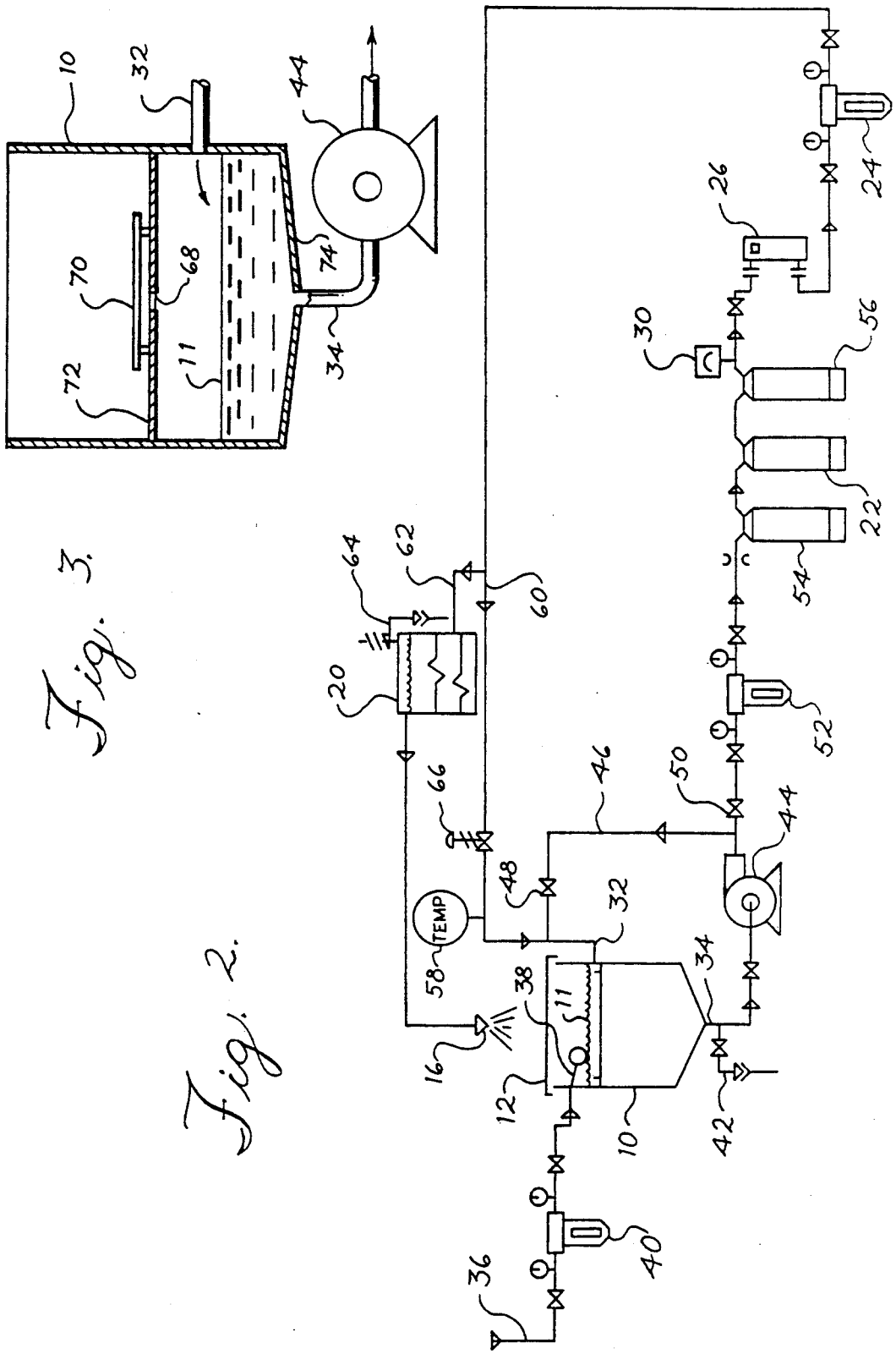

SELF-CONTAINED WASHING UNIT FOR PRINTED CIRCUIT BOARDS

BACKGROUND OF THE INVENTION

1. Field of the Invention

This invention relates, in general, to liquid cleaning apparatus and, more specifically, to deionized water cleaning of printed circuit boards.

2. Description of the Prior Art

Components are soldered to electrical printed circuit boards (PCB's) with the aid of solder fluxes which leave a residue on the board after the soldering process has been completed. For various reasons, it is desirable to remove the flux from the boards after the soldering process. Traditionally, volatile solvents have been widely used to wash solder flux from PCB's. However, such solvents can have negative environmental impacts and are being phased out in favor of other washing liquids.

With the recent use of water-based fluxes, it is possible to use water as the washing liquid for PCB's soldered with this type of flux. In order to keep the rinse water from contaminating outside waste water disposal systems, the water used for washing PCB's is passed through a series of filters to remove the contaminants from the water. This permits reuse of the same water in a closed-loop cleaning system. Deionizing the water also provides a method of purifying the water and allowing it to be recirculated again throughout the cleaning process. Such systems are currently in use at factories or shops where PCB's are soldered. Although such systems provide certain advantages over prior art systems, they may require large filter systems and a considerable amount of fixed plumbing to be installed at the factory location. Along with being dependent upon permanently installed filters, pumps, piping, etc., such systems are usually confined to a specific location on the factory floor. When the need to have a washing station at another location arises the traditional fixed systems are not very cost efficient in providing the new or alternate washing station. Therefore, it is desirable, and an object of this invention, to provide a PCB washing system which can be easily adapted for use at various locations throughout the factory.

U.S. Pat. No. 3,595,252, issued on Jul. 27, 1971, discloses a self-contained washing unit intended for use in washing scientific glassware with deionized water. This system includes a container housing, collection tank, pump, and deionizer which cooperate with each other to allow the water to recirculate between washing and purification operations. Although apparently useful for the intended application, there are significant differences between the structure of the patented device and the apparatus disclosed herein for washing PCB's.

SUMMARY OF THE INVENTION

There is disclosed herein a new and useful washing system suitable for use as a self-contained unit for cleaning flux from printed circuit boards. The system uses deionized water in a recirculating, closed-loop arrangement wherein the water is filtered and cleaned after it washes a printed circuit board. Water is diverted from the normal recirculating flow path, heated, and sprayed onto the board(s) being washed. The system components are selected and arranged to provide environmentally safe operation and economical operating costs. All of the system components are supported by a platform which can be easily moved from one location to another.

According to a specific embodiment of the invention, an integrated washing-collection tank is used to collect water in a sump area after it has been used for washing a printed circuit board. The walls of the tank are used to dissipate heat from the collected water before it is pumped to filters secured on a common supporting platform. During standby conditions, the filtered water is directed back into the sump area of the tank. When a circuit board is to be washed, the water is diverted from this normal recirculating path and directed through an on-demand hot water heater. The heated water is sprayed onto the boards being washed and the contaminated water flows into the sump where it loses heat and it is routed to the filtering system.

BRIEF DESCRIPTION OF THE DRAWINGS

Further advantages and uses of this invention will become more apparent when considered in view of the following detailed description and drawings, in which:

FIG. 1 is an overall view of a self-contained washing unit constructed according to this invention;

FIG. 2 is a schematic diagram of the washing unit shown in FIG. 1; and

FIG. 3 illustrates details of the rinse tank used with the washing system.

DESCRIPTION OF THE PREFERRED EMBODIMENTS

Throughout the following description, similar reference characters refer to similar elements or members in all of the figures of the drawings.

Referring now to the drawings, and to FIG. 1 in particular, there is shown a self-contained washing unit constructed according to a specific embodiment of the invention. The system includes the washing tank 10 which can be closed by the cover 12. The printed circuit boards (PCB's) to be washed are placed upon a work surface within the tank 10 and are sprayed with deionized water to wash the flux from the printed circuit boards. The operator uses the flexible hose 14, which has the valve or nozzle 16 attached to its end, to direct a water spray upon the printed circuit boards located within tank 10.

All of the components of the cleaning system are supported either directly, or indirectly, from the supporting platform 18, as shown in FIG. 1. This makes it convenient to move the entire cleaning system from one location to another. Typically, all that is needed after a move is made is to connect the unit to a power source and to a source of replenishing water. For convenience, an accessible drain is usually desirable.

The water used to wash the printed circuit boards is recirculated through the filtering components of the system to remove the contaminants put into the water during the cleaning process. This allows the water to be recirculated and used over again, thereby conserving the heat already existing in the return water from the tank 10, and eliminating the discharge of polluted water into a disposal system. The hot water tank 20 is of the on-demand type, or instant heating type, so that water drawn through the tank is heated primarily as it flows through the tank. Water is heated before it is applied to the printed circuit boards in order to enhance the washing action of the water. The recirculating water does not normally flow through the water heater 20 unless the hose 14 is being used to spray the printed circuit boards. Otherwise, the recirculating water bypasses the hot water heater and flows directly into a portion of the tank 10.

In addition to the water heater 20, the important components of the cleaning system which are illustrated in FIG. 1 include the filter 22, the filter 24, and the purifier 26. All of these components are included in the recirculating path of the water to clean and purify the water after it has been used to wash the printed circuit boards. A further description of the location and function of these components is included herein in conjunction with FIG. 2. The electrical control panel 28 is used to furnish a junction between the connecting electrical service cable and the electrical components mounted on the supporting platform 18. For the purpose of determining the purity of the water in the recirculating system, a resistivity meter 30 is used by the operator. This measures the ohmic resistance of the water and, the higher the resistance, the cleaner the water.

FIG. 2 is a schematic diagram of the washing unit shown in FIG. 1. The fluid level 11 in the tank 10 is maintained by the fluid or water entering the tank 10 through the nozzle 16 or directly through the inlet pipe or line 32. Water leaves or is removed from the tank 10 through the outlet pipe or line 34. Inlet line 36 is connected to a source of water which may be used to replenish water which has been lost in the recirculating system. This is controlled by the float switch 38 which can detect a change in the fluid level 11 and allow water to enter the tank 10 from the inlet line when the fluid level is lower than desirable. The pre-filter 40 filters particulate or solid matter out of the incoming water. In this specific embodiment, the pre-filter 40 filters out all particulates larger than 1 micron.

Tank drain 42 is used only during the removal of the recirculating water from the system. Normally, all of the water used to wash a printed circuit board is recirculated by the pump 44 through the various filtering components of the system. Pump 44 is run continuously when the system is being used, thereby circulating water between the inlet line 32 and the outlet line 34. Bypass line 46 can be placed into the flow path by proper setting of the valves 48 and 50 to allow the recirculating fluid to bypass the filtering components when this is desired.

The actual filtering process consists of the post filters 52 and 24 which also filter particulate or solid matter from the water. In this specific embodiment, filter 52 filters particles above 0.45 microns and filter 24 filters particles above 0.2 microns. Other filtering and purifying components acting upon the recirculating water include the activated carbon filter 54 the primary deionizer 22, the secondary deionizer 56, and the ultraviolet sterilizer 26. The resistivity meter 30 measures the resistance of the water to give an indication of the purity of the water in the recirculating system. Thus, various processes are used to filter the contaminants out of the water used to wash the printed circuit boards, thereby allowing the water to be recirculated and used again. As mentioned earlier, this improves the environmental aspects of the cleaning operation and provides a more economical approach since the temperature of the water can be maintained more easily and more economically. Temperature is measured by the temperature gauge 58.

In order to wash the printed circuit boards contained within the tank 10, the operator uses the nozzle 16 on the end of the flexible hose 14 to spray water upon the printed circuit boards. When the nozzle 16 is opened, water is diverted from the flow path or line 60 and enters line 62 which leads to the water heater 20. Immediately, this water is heated by the water heater 20 and is directed by hose 14 to the washing tank 10. Pressure relief valve 64 adds an additional degree of safety to the apparatus. Therefore, as can be seen from FIG. 2, when the boards are to be washed, the washing water is diverted from the recirculating path and proceeds through an on-demand hot water heater before being sprayed upon the printed circuit boards. The back pressure regulator 66 is used to aid or enhance the diversion action by maintaining a certain restriction to the flow of the water through the line 60. Without the regulator 66, diversion through line 62 is more difficult since water would tend to flow through line 60 with as much ease as it could flow through line 62.

FIG. 3 illustrates details of the rinse tank used in the washing system shown in FIG. 1. According to FIG. 3, the tank 10 holds a reservoir, or sump, of water from the bottom 74 of the tank to the water level 11. During standby conditions, deionized water enters the sump area through the inlet line 32 to keep the water in the sump circulating. It is removed through the outlet line 34 by the pump 44. Hotter water used to wash the PCB 70 also is collected in the sump area. The walls of the tank 10 are constructed of a metallic material. This provides good radiation of heat from the water flowing through the opening 68 after it is heated and sprayed onto the printed circuit board 70 and collected in the sump. The conduction properties and the size of the sump area are sufficient to lower the water temperature before it is applied to the filter system. In particular, some of the resin bed filters can be damaged by water temperatures above 140 degrees Fahrenheit.

The PCB is placed above the work surface, or platform 72, to receive the spray of heated, deionized water. Although shown as supported from the surface 72, the board may also be simply held by the operator above the surface 72 during the washing operation. More than one PCB may be positioned for washing at the same time.

It is emphasized that numerous changes may be made in the above-described system without departing from the teachings of the invention. For example, some of the components of the washing unit may be supported from each other rather than directly from the supporting platform. Also, the types and locations of the filters may be changed, and the flexible spray hose may be located within the tank enclosure. In addition, wheels or casters may be used on the platform to facilitate movement to another location. It is intended that all of the matter contained in the foregoing description, or shown in the accompanying drawings, shall be interpreted as illustrative rather than limiting.

We claim:

1. A washing system suitable for use as a self-contained unit for cleaning flux from soldered printed circuit boards, said washing system comprising:
   a supporting platform suitable for movement from one location to another location;
   sump means located on said supporting platform for catching a fluid after it is used to wash a printed circuit board;
   a recirculating filter system, attached to said supporting platform, which removes the fluid from the sump means, removed foreign matter from the fluid, and directs the cleansed fluid back into the sump means;

means for heating fluid; and means for diverting at least a portion of the recirculating fluid into said heating means, onto a printed circuit board, and into the sump means.

2. The washing system of claim 1 including means for restricting the flow of recirculating liquid between filters in the filter system and the sump means.

3. The washing system of claim 1 wherein the diverting means includes a valve means controllable by an operator to regulate the amount of fluid diverted through the heating means.

4. The washing system of claim 3 wherein the diverting means includes a flexible hose terminated with an operator actuated nozzle.

5. The washing system of claim 1 including means for replenishing the recirculated fluid.

6. The washing system of claim 1 wherein the sump means is integrated together with a work platform where the printed circuit board is placed when being washed.

7. The washing system of claim 1 wherein the fluid heating means primarily heats the fluid only when the fluid flows through the heating means.

8. The washing system of claim 1 wherein the sump means includes a sufficient sump volume and heat dissipating area to effectively lower the temperature of the fluid, used to clean a board, before being filtered.

9. A washing system suitable for use as a self-contained unit for cleaning flux from soldered printed circuit boards, said washing system comprising:

a supporting platform suitable for easy movement to a plurality of locations;

an integrated work platform and sump means for catching water after it has been used to wash a printed circuit board positioned over the work platform;

a recirculating filter system, attached to said supporting platform, which removes the water from the sump means, uses filters to remove ions from the water, and directs the deionized water back into the sump means;

means for heating water; and means for an operator to divert at least a portion of the recirculating water into said heating means and onto the printed circuit board positioned over the work platform to supply the water used to wash the printed circuit board.

10. The washing system of claim 9 including means for restricting the flow of recirculating water between the filters in the filter system and the sump means.

11. The washing system of claim 9 including means for replenishing the recirculated water.

12. The washing system of claim 9 wherein the water heating means primarily heats the water only when the water flows through the heating means.

13. The washing system of claim 9 wherein the sump means includes a sufficient sump volume and heat dissipating area to effectively lower the temperature of the heated water, used to clean a board, before being filtered.

14. A washing system suitable for use as a self-contained unit for cleaning water-based solder flux from printed circuit boards, said washing system comprising:

a supporting platform suitable for easy movement to a plurality of locations;

an integrated work platform and sump means for catching water after it has been used to wash a printed circuit board positioned above the work platform, said sump means having a sufficient volume and heat dissipating area to effectively lower the temperature of the water, used to clean a board, before being filtered;

a recirculating filter system, attached to said supporting platform, which removes the water from the sump means, removes ions from the water, and directs the deionized water back into the sump means;

means for on-demand heating of water, with the input of said heating means connected to the flow path of the deionized water directed back into the sump means;

restrictor means located downstream of the connection to the heating means in the deionized water flow path, said restrictor means restricting the flow of the deionized water to the sump means and aiding the flow of water through the heating means;

means for replenishing the amount of water in the recirculating flow path; and a flexible hose having a nozzle at one end and being attached at the output of the heating means, said hose and nozzle allowing an operator to divert at least a portion of the recirculating deionized water through said heating means and onto the printed circuit board positioned above the work platform for the purpose of cleaning the board.

* * * * *